United States Patent [19]

Nadd

[11] Patent Number: 5,497,285
[45] Date of Patent: Mar. 5, 1996

[54] POWER MOSFET WITH OVERCURRENT AND OVER-TEMPERATURE PROTECTION

[75] Inventor: Bruno C. Nadd, Puyvert, France

[73] Assignee: International Rectifier Corporation, El Segundo, Calif.

[21] Appl. No.: 121,288

[22] Filed: Sep. 14, 1993

[51] Int. Cl.$^6$ ...................................................... H02H 3/08
[52] U.S. Cl. ........................ 361/103; 327/405; 327/429; 361/18; 361/91
[58] Field of Search ............................... 361/18, 103, 98, 361/91; 363/21; 123/416; 323/268–272; 327/405, 407, 415, 429; 257/379, 154, 165, 167, 390

[56] References Cited

U.S. PATENT DOCUMENTS 5,398,148  3/1995  Perkins et al. ............................ 361/18

FOREIGN PATENT DOCUMENTS

| 0090280 | 5/1983 | European Pat. Off. . |
|---|---|---|
| 0107137 | 2/1984 | European Pat. Off. . |
| 2482800 | 5/1980 | France . |

OTHER PUBLICATIONS

Elecktronik, vol. 31, No. 1, Jan. 1982, p. 71, Reinhold Oesterhaus, "Ansteuerung Von Leistungs–Feldeffekt–transistoren über Optokoppler" figure.

Primary Examiner—Peter S. Wong
Assistant Examiner—Aditya Krishnan
Attorney, Agent, or Firm—Ostrolenk, Faber, Gerb & Soffen

[57] ABSTRACT

A power integrated circuit is pin-compatible with a three-terminal power MOSFET and contains integrated circuits to turn off the device in the event of an overcurrent or an over-temperature condition. Control power voltage $V_{cc}$ is applied through a first MOSFET connected between the gate pin and the gate electrode of the power device. A second control MOSFET is connected across the power device gate and source electrodes. The first control MOSFET is turned off and the second control MOSFET is turned on in response to a fault condition. The turn off of the first MOSFET limits the current sinked by the gate pin. A novel boot strap circuit is disclosed which permits the use of all N channel MOSFETs with an N channel power device, and a novel trimmable temperature shutdown circuit is provided. An integrated bipolar transistor is also integrated into the chip to prevent conduction of the P well/N epi diode formed in the device substrate.

17 Claims, 5 Drawing Sheets

FIG_1_
PRIOR ART

FIG_2_

FIG. 3 (BOOTSTRAP CIRCUIT)

FIG. 4.
(TEMPERATURE SHUTDOWN)

POWER MOSFET WITH OVERCURRENT AND OVER-TEMPERATURE PROTECTION

BACKGROUND OF THE INVENTION

This invention relates to power MOSFETs and more specifically relates to a power MOSFET having integrated on the same semiconductor die, novel over-temperature and overcurrent protection circuits.

Power MOSFETs are well known in the art. A particularly well-known power MOSFET is manufactured and sold by International Rectifier Corporation of El Segundo, Calif., under its registered trademark HEXFET. Such power MOSFETs are adapted to handle electrical power of at least about 1 watt and can be switched on and off by applying and removing a low voltage control signal between the gate and source electrodes of the device. They are packaged in various package styles, for example, a TO-220 style package which typically presents three terminals, gate, source and drain, for connection in an electrical circuit.

It is known to be desirable to turn off a power MOSFET, or otherwise control the circuit in which it is connected, when the current flow between the source and drain electrodes exceeds a particular value, for example, 5 times rated current, or when the die temperature exceeds a certain value, for example 150° C. Some known devices act to turn off a power MOSFET in response to either high current or high temperature, and others respond to either condition.

For example, one known device employs a small bipolar thyristor die which is glued to the power MOSFET die and turns on to connect the MOSFET gate to the MOSFET source when the MOSFET die temperature exceeds a given value. This device, however, has too long a thermal time constant to offer short circuit protection.

Another known device employs a small bipolar transistor chip with emitter and collector electrodes connected between the power MOSFET gate and source terminals. The bipolar transistor base to emitter circuit is connected across a voltage dropping resistor in the power MOSFET source circuit, so that the bipolar transistor turns on under short circuit conditions to short the power MOSFET gate to the source and limit current. However, if the power FET is exposed to a high current which is less than short circuit current, the control bipolar transistor simply reduces the power MOSFET drive, causing very high power dissipation and possible destruction of the device. Moreover, this circuit does not monitor the temperature of the power MOSFET die.

A third known device employs a current-sensing power MOSFET which has a limited number of cells of the MOSFET devoted to production of an output signal which is representative of the main power current, and also has a temperature monitoring circuit to monitor the temperature of the MOSFET die. The circuits for these functions are integrated into the power MOSFET die, but require an auxiliary power source to power these circuits. This auxiliary power is applied to the power MOSFET via a fourth terminal, in addition to the source, drain and gate terminals. Consequently, the device is not pin compatible with existing power MOSFETs.

A fourth known device provides current and temperature sensing and has only three pins (gate, source and drain) but this device employs a 4K voltage dropping resistor connected between the gate pin and gate electrode in order to limit the input current in case of a fault. The protect circuit then operates to turn on an auxiliary MOSFET connected between the gate to source terminals of the power MOSFET to turn off the power MOSFET under given overcurrent or over-temperature conditions.

The voltage dropping resistor in the above 10 device is subject to stringent design tradeoffs. Thus, if the resistor value is too low, a high pin current will be drawn through the turn-off MOSFET. If the resistor value is too high, switching time is increased for the main power FET.

BRIEF SUMMARY OF THE INVENTION

In accordance with the invention, the gate pin and the input voltage for the power MOSFET is connected to the gate electrode through a first series connected control MOSFET. A second control MOSFET is connected between the gate and source electrodes of the power MOSFET. The gates of the first and second MOSFETs are controlled by the outputs of the protect circuit such that the first is turned off and the second is turned on in response to a given fault condition. The protect circuit is powered by the input source voltage to the series MOSFET. When on, the second MOSFET can have a resistance of about 200 ohms. Thus, the switching time of the main power device will be about 20 times faster than that of the prior art device using a 4,000 ohm resistor. The current drawn from the gate pin and through the series MOSFET is, typically, 660 µA but can be lower, depending on the design of the protect circuit which draws the current.

The protect circuit operates such that, when an overcurrent or over-temperature is measured by the protect circuit, the first MOSFET turns off to isolate the gate from input voltage and to limit the current sinked by the gate pin, and the second MOSFET turns on to short the power MOSFET gate to its source, thus turning off the device at high speed.

The novel invention described above is applicable to any power MOSFET type device over all voltage and current ranges. This includes devices using a MOSgate to control the switching on and off of a device and expressly includes IGBTs, power integrated circuits, MOSgate controlled thyristors (MCTs) and power FETs such as the HEXFET device previously described.

In accordance with a further feature of the invention, a novel "boot-strap" circuit is provided to provide a gate voltage for the series MOSFET described above which is higher than the input gate voltage of the power MOSFET. More specifically, if the power MOSFET is an N channel device, and the series MOSFET is also an N channel device, the gate voltage to turn on the series MOSFET must be higher than the input gate voltage. The novel boot strap circuit employs all N channel MOSFETs and contains a capacitor which, when charged, increases the voltage on the gate of the series MOSFET to above the voltage at the gate pin so that the series MOSFET can turn on when potential is applied to the gate pin of the power MOSFET.

As a still further feature of the invention, there is provided a novel temperature shutdown circuit and a novel trimmer circuit for trimming the set temperature. The novel temperature shutdown circuit has a first transistor circuit configured to produce a gate voltage for a control MOSFET which increases with temperature, and a second transistor circuit (inverter) which has an input threshold with a negative temperature coefficient. These two output characteristics are combined such that their intersection defines a threshold temperature which, if reached, produces an output to trigger the turn-off of the main power MOSFET. The exact value of the crossover can be trimmed by trimming the working area of a transistor in a zero temperature coefficient segment of the circuit.

A further feature of the present invention is a novel structure and circuit to prevent conduction of the P well containing the control components for the power MOSFET if the N(−) substrate goes to a negative potential relative to the source of the power MOSFET. More specifically, a novel bipolar switching transistor is built into the substrate adjacent the P well. This transistor has its collector connected to the P well whereby, if the N(−) substrate goes negative with respect to the source, the bipolar transistor shorts the P well to the N(−) substrate and prevents conduction of the diode formed at the junction of the P well and N(−) body.

Other features and advantages of the present invention will become apparent from the following description of the invention which refers to the accompanying drawings.

DETAILED DESCRIPTION OF THE DRAWINGS

Figure 1:
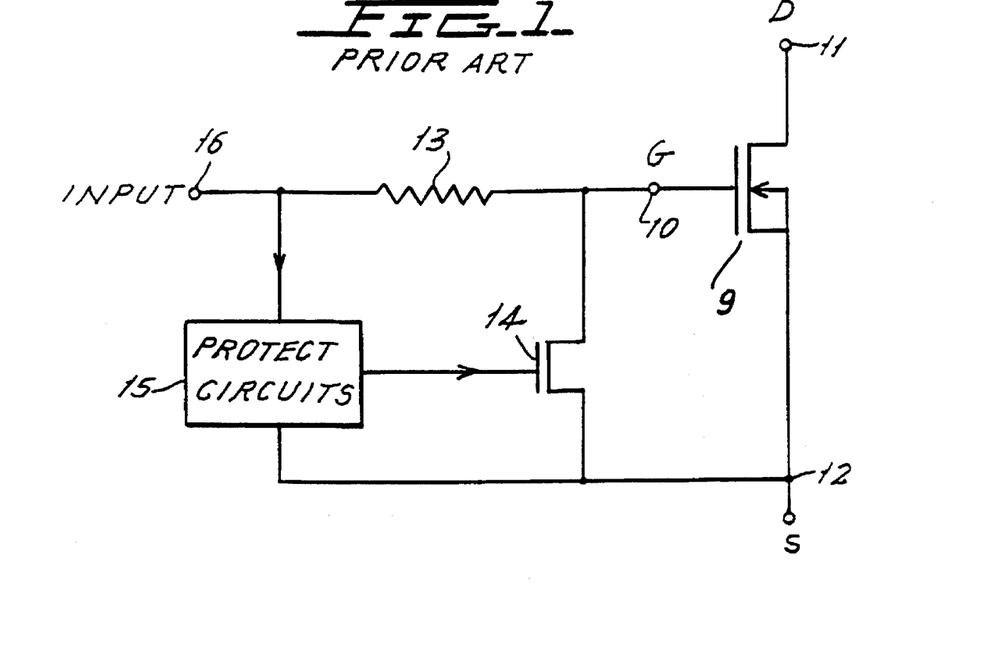
FIG. 1 shows a prior art overcurrent and over-temperature control circuit for a power MOSFET.

Referring first to FIG. 1, there is shown a prior art power MOSFET 9, with over-temperature and overcurrent protection circuits. The power MOSFET has a conventional power section having gate, drain and source terminals 10, 11 and 12. Integrated into the same die which contains the power section is a control section including a 4K resistor 13, a control MOSFET 14 and the protect circuits 15. Note that the source acts as a ground for the internal protective circuits. While not shown, the power MOSFET section may have a current sense section which delivers source current information to the protect circuits 15. An input terminal 16 (sometimes referred to as a gate or input pin) is the third terminal pin of the device along with terminal pins 11 and 12. Thus, the device is pin-compatible with power MOSFETs without integrated protective circuits.

In operation, the operating power for the protect circuits is derived from input pin 16 which is from 5 to 10 volts. In the absence of a fault, MOSFET 14 is off and no current flows in resistor 13. If a fault condition occurs, MOSFET 14 turns on and, with a 200 ohm MOSFET on-resistance, draws from 1250 µA to 2500 µA through resistor 13, for a 5 volt and 10 volt supply respectively at pin 16.

The value of resistor 13 is a tradeoff between the switching time of the power MOSFET, which increases with higher resistance, and the current drain from input pin 16, which increases as the value of resistor 13 reduces. A resistor value of 4000 ohms produces a switching time of about 15 microseconds and a current drain on the input of 3 to 4 milliamperes (at a 10 volt input).

Figure 2:
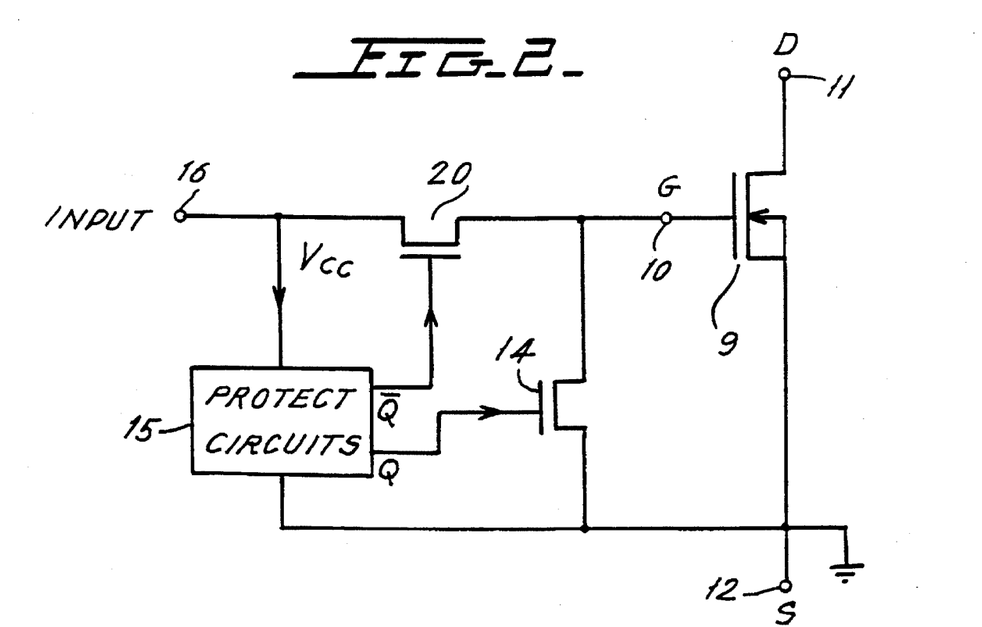
FIG. 2 shows a circuit diagram of the novel circuit of the invention for deriving control circuit power from the gate supply circuit.

The novel circuit of FIG. 2 provides the necessary $V_{cc}$ to power the protective circuits, but retains much higher switching speed and a much lower current drain on the input terminal. More specifically, in FIG. 2, components similar to those of FIG. 1 have the same identifying numerals although, in FIG. 2, the power MOSFET can be any MOSgated device, for example, an IGBT or MOSgated thyristor or the like.

In the present invention, the resistor 13 of FIG. 1 is replaced by a MOSFET 20 which, like MOSFET 14, is controlled by an output from the protect circuits 15. MOSFETs 14 and 20 are operated in opposite phase.

Thus, when a voltage appears at terminal 16 to turn on the main power MOSFET, the MOSFET 14 is off and MOSFET 20 turns on to charge the gate at terminal 10 of the power MOSFET. The MOSFET 20 is designed to produce a resistance of about 200 ohms. Therefore, it has only a minor effect on the turn-on and turn-off switching times of the power MOSFET which is 20 times faster than with the 4000 ohm resistor of FIG. 1.

To implement the circuit of FIG. 2 with a simple process, it is desirable that the power MOSFET is an N channel device, and that the MOSFET 20 also be an N channel MOSFET. The gate voltage to turn on MOSFET 20, however, is then higher than the voltage at the pin 16.

Figure 3:
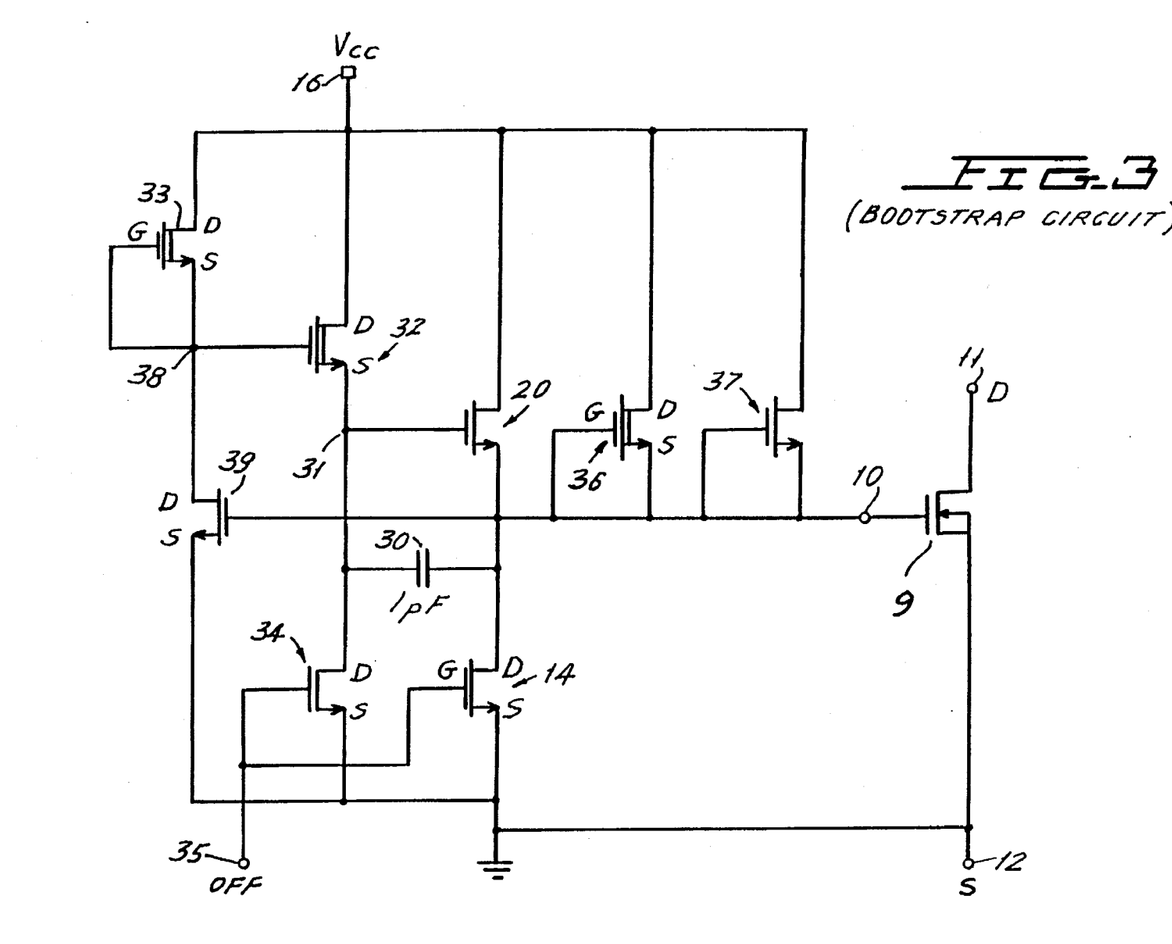
FIG. 3 shows a novel bootstrap circuit used with the present invention to permit use of N channel control MOSFETs in an N channel power MOSFET.

In accordance with the invention, a novel "boot-strap" circuit, shown in FIG. 3, is provided to generate a high enough gate voltage to operate MOSFET 20 if it is an N channel device.

Referring to FIG. 3, components similar to those of FIG. 2 are given the same identifying numerals. Thus, pin 16 is connected in series with MOSFET 20 to gate 10 of the power MOSFET section, and MOSFET 14 connects pin 16 and MOSFET 20 to pin 12.

Also provided in FIG. 3 is a boot-strap capacitor 30 connected between the node between MOSFETs 14 and 20, and the node 31 between the gate electrode of MOSFET 20 and a depletion mode MOSFET 32. The depletion mode MOSFET 32 is connected to the gate and source of depletion mode MOSFET 33. Node 31 is further connected to a shutdown driver MOSFET 34 having a gate connected to terminal 35 to which "smart" circuits which develop turn-off information produce an input to cause turn off of the power MOSFET.

Also provided in FIG. 3 is an added depletion mode MOSFET 36 which provides an added current path to ensure permanent turn-on of the power section and a MOSFET 37, which acts as a diode, to ensure turn-off of the power section in response to a signal at terminal 16.

The operation of the boot-strap circuit of FIG. 3 is as follows: When a voltage $V_{cc}$ is applied to terminal 16, the potential at node 38 will follow $V_{cc}$ because MOSFET 39 is off. The transistor 32 next turns on and node 31 begins to charge up to $V_{cc}$. Since node 31 is at $V_{cc}$, MOSFET 20 turns partially on and starts to charge the gate of the power MOSFET at terminal 10. When terminal 10 reaches the threshold voltage of MOSFET 39, it turns on. Node 38 then drops to ground and MOSFET 32 turns off. Node 31 is now floating, and capacitor 30 stays charged, and MOSFET 20 stays fully on. At the end of this switching process, the voltage at node 31 is, theoretically $2 \times V_{cc}$, (but is less because of leakage and charge sharing). The boot-strap capacitor 30 is a 1 picofarad capacitor.

In order to turn off the power section in response to an output from the intelligence section of the circuit, a signal is applied to terminal 35 to turn on MOSFET 34 and to cause the turn-off of the MOSFET 14 and the power circuit.

It is to be understood that all components of FIG. 3 are N channel devices, integrated into the same silicon die as the power section.

Figure 4:
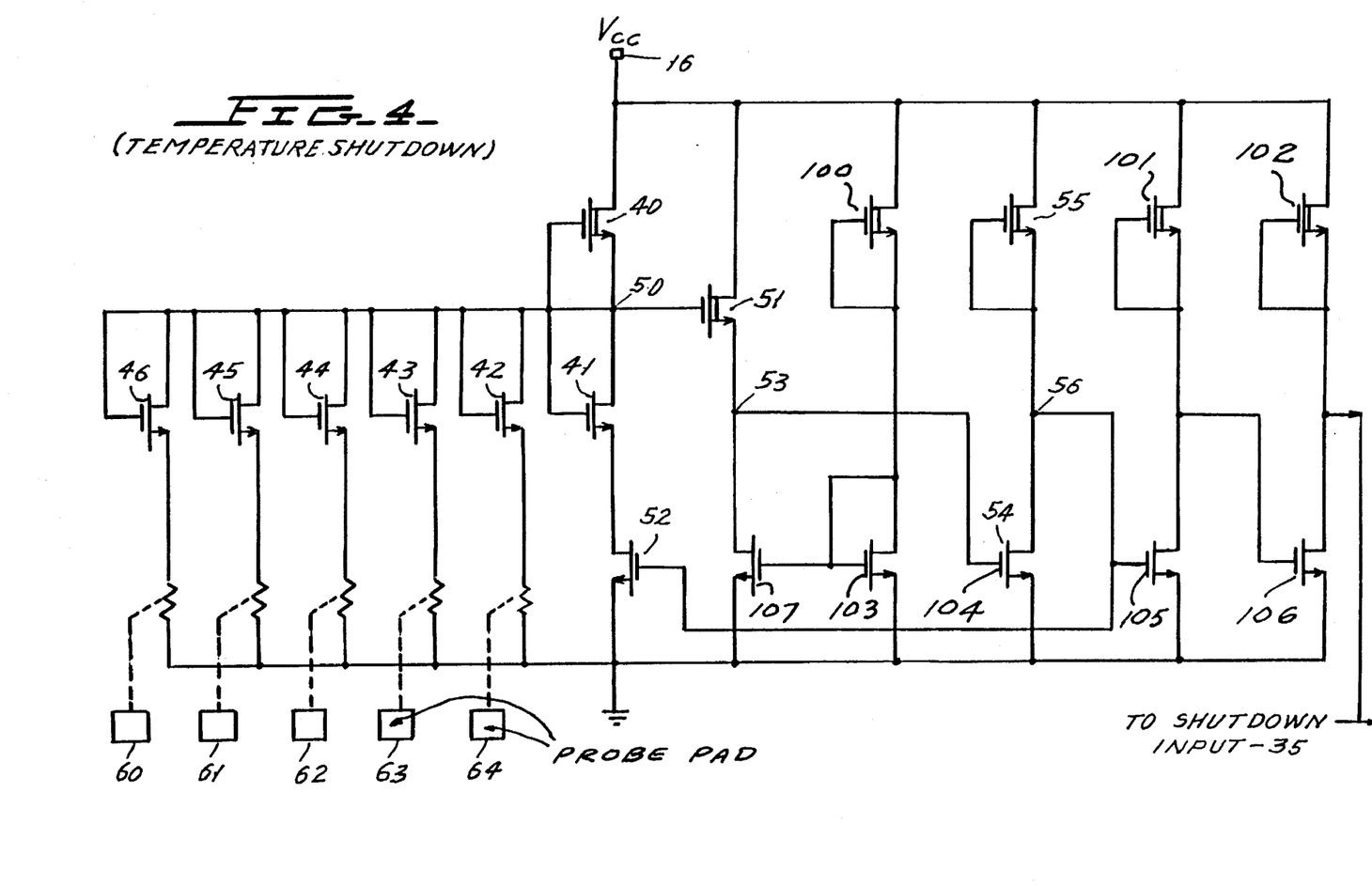
FIG. 4 shows a novel temperature shutdown circuit for use with the circuits of FIGS. 2 and 3.

FIG. 4 shows one of the intelligence circuits which is operated from $V_{cc}$ of FIGS. 2 and 3, and which applies a turn-off signal to terminal 35 when a given over-temperature condition is measured. In FIG. 4, the pin 16 is connected to MOSFET 40, which is a constant current source and then to MOSFET 41. The MOSFET 41 is connected in parallel with other MOSFETs 42 to 46, which are trimmer areas which can be removed from the circuit, as will be later described.

The node 50 is intended to have a zero temperature coefficient so that the potential at that node, preferably about 1.6 volts for a selected process, is fixed by trimming the area of transistor 41 and its parallel transistors 42 to 46. The node 50 has a constant voltage because its potential $V_{gON}$ can be expressed as the sum of the threshold voltage $V_{TH}$ of transistor 41 (a negative temperature coefficient) and the quantity $I_d/g_m$, where $I_d$ is the drain current of transistor 41 and $g_m$ is the $g_m$ of transistor 41. Since $g_m$ has a negative temperature coefficient, the quantity $I_d/g_m$ has a positive temperature coefficient.

Figure 4A:
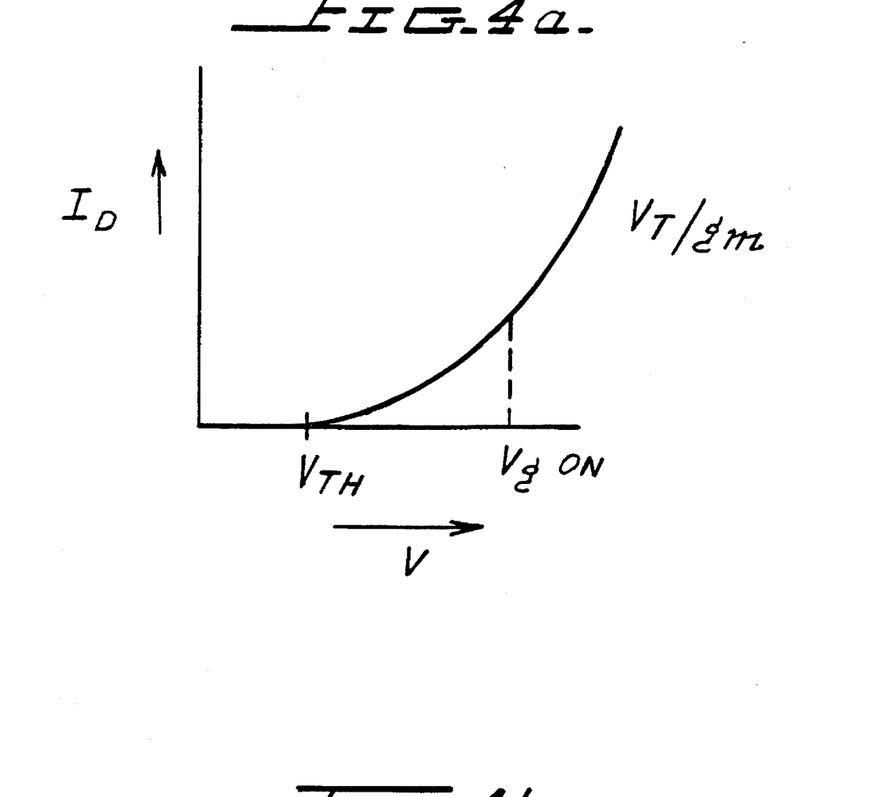
FIGS. 4a and 4b show characteristic curves for the circuit of FIG. 4.

The above is illustrated in FIG. 4a where $V_{gON}$ is a fixed value for a given drain current for transistor 41.

More specifically, the curve shown in FIG. 4a has the form:

$$I_D = K_P (V_{gs} - V_{TH})^2$$

The quantity of $V_{gON}$ can be expressed as:

$$V_{gON} = V_{TH} + \sqrt{I_D/K_P}$$

where $K_P$ has a negative temperature coefficient. Since $K_P$ has a negative temperature coefficient, the temperature coefficient of $\sqrt{I_D/K_P}$ is positive.

At a low current $I_D$, the value $V_{TH}$ dominates, producing an overall negative temperature coefficient. At high $I_D$, the value $\sqrt{I_D/K_P}$ dominates, producing a positive coefficient.

However, there is only one value of $I_D$ for which $$\frac{\partial V_{gON}}{\partial \theta} = 0.$$

This value represents the trimmed point of the circuit, as is later described.

The potential at node 50 of FIG. 4 is connected to MOSFET 51 which is connected in series with a MOSFET 52, operated as a current source. The voltage at node 53 has a positive temperature coefficient, and is applied to the gate of MOSFET 54. MOSFET 54 is connected to the MOSFET 55.

The voltage at node 56 may now be considered, and it will be seen that, for a temperature higher than a given fixed value, the MOSFET 54 turns on and, for a temperature lower than that value, it remains off. This operation is demonstrated in FIG. 4b, where curve $V_{53}$ is the voltage at node 53 (a positive temperature coefficient) and $V_{TH}$ is the threshold voltage of transistor 54 (a negative coefficient). The intersection of these curves defines the shutdown temperature since a temperature higher than this value $T_{SHUTDOWN}$ turns on MOSFET 54 while a temperature lower than this value leaves the MOSFET 54 off.

The voltage at node 56 is then applied through a logic inverter circuit to the shutdown input terminal 35 in FIG. 3.

Figure 4B:
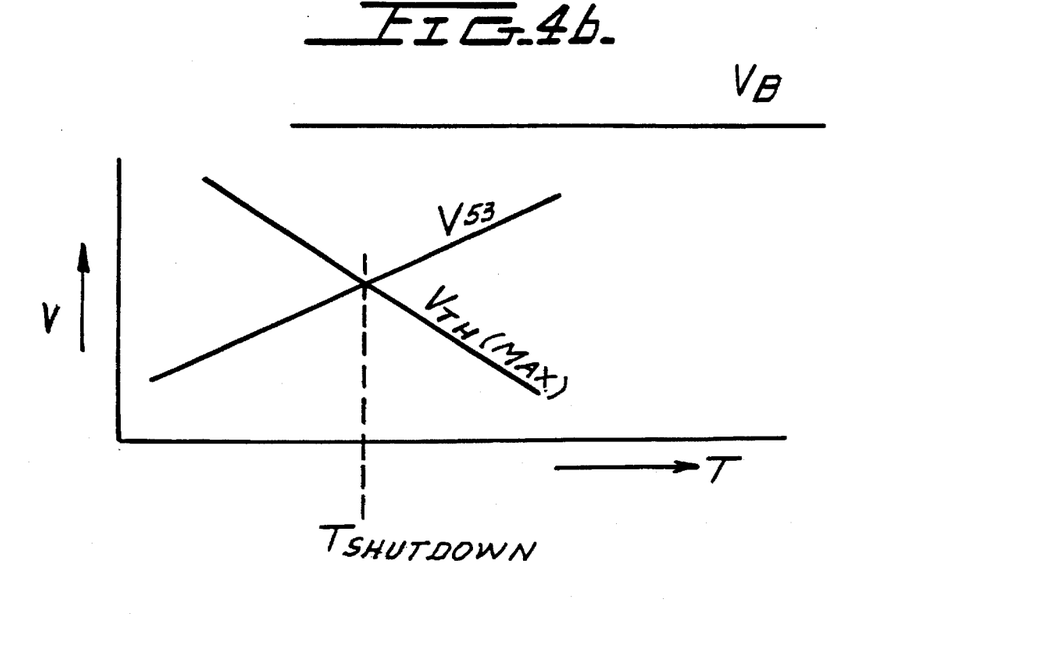

Thus, when the temperature of the die containing the power FET exceeds the temperature $T_{SHUTDOWN}$ in FIG. 4b, the power section is turned off. MOSFET 52 creates a positive feedback circuit and provides some hysteresis on the value of $T_{SHUTDOWN}$.

Also shown in FIG. 4 are depletion mode MOSFETs 100, 101, 102 and 103 disposed like MOSFET 55 and respective series connected MOSFETs 103, 104, 105 and 106. A further MOSFET 107 is connected in series with MOSFET 51.

As stated previously, the size of transistors 41 to 46 must be trimmed to ensure a zero temperature constant at node 50. The trimming is accomplished by assigning different areas to transistors 41 to 46 and then open-circuiting those transistors which must be removed to provide the desired temperature compensation at node 50. By way of example, probe pads 60 to 64 can be provided for transistors 46 to 42, respectively. These pads can be connected to respective zener diodes, not shown, which can be blown in short circuit by a potential applied to the pad in order to remove one or more of transistors 42 to 46 from the circuit. To carry out the trimming operation, the die is held at a temperature of 160° C. and a binary search is made to determine which transistor areas must be removed for good temperature compensation. The necessary zeners are then blown to short circuit their respective transistors in the well-known manner.

Figure 5:
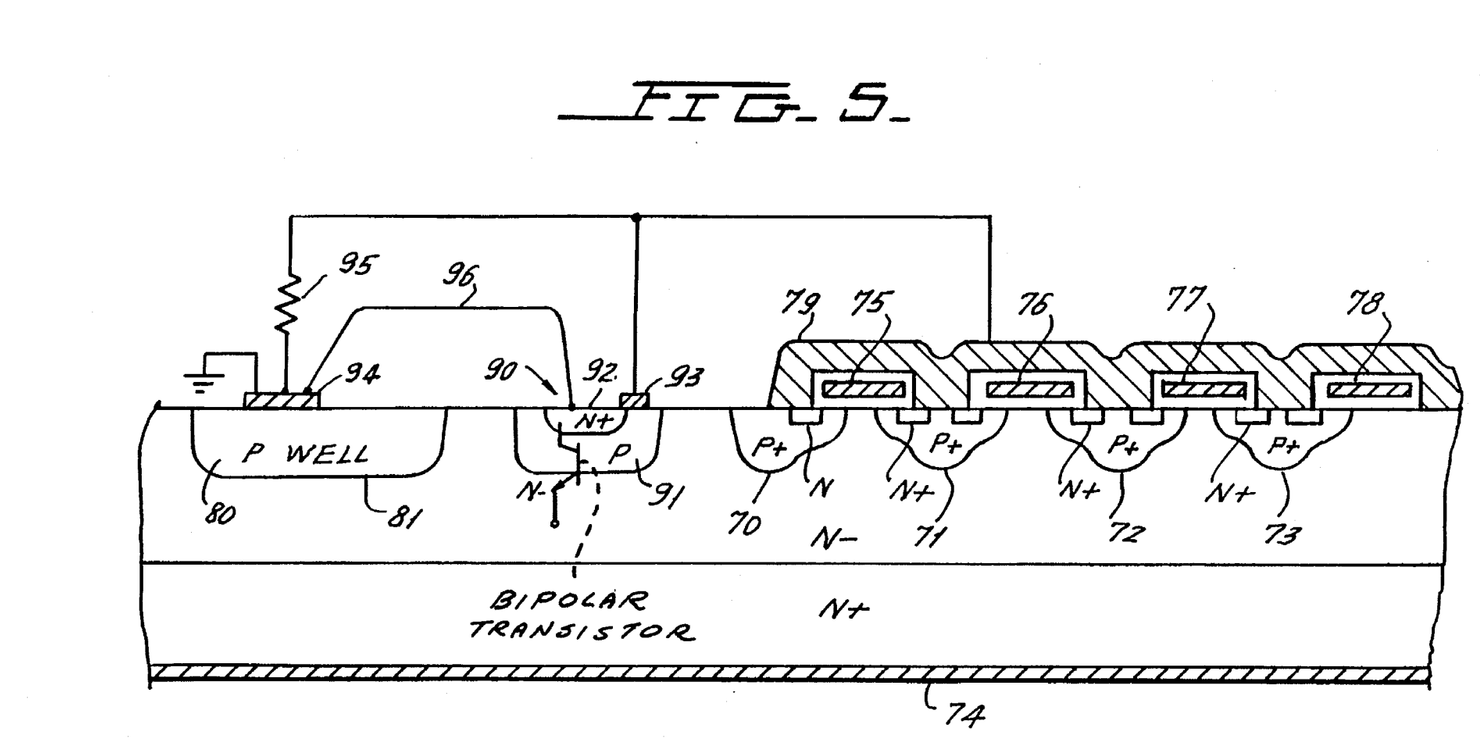
FIG. 5 shows a cross-section of a power MOSFET die having a P well for receiving the control circuits integrated into the die, and further shows a novel circuit to prevent the forward bias of the P well/N(−) substrate junction.

Referring next to FIG. 5, there is illustrated a cross-section of a junction pattern of a small part of a power MOSFET and the P well which carries the control circuits which have been described. Thus, in FIG. 5, as section of a die is shown containing a plurality of P+ base cells diffused into an N(−) epitaxial body. The epitaxial body is commonly formed on an N+ substrate which has a drain electrode 74 on its bottom. A large number of cells can be used, frequently in excess of several thousand, which are symmetrically disposed over the surface of the N(−) body. The topology of these cells can be as desired and they may have any polygonal shape, such as hexagons, elongated rectangles or squares. The power section can also use an interdigitated topology.

Each of the base cells contains a respective N+ source region to define invertible channel regions in the P bodies which are covered by a gate oxide and then by polysilicon gates 75 to 78. The gates are insulated and a source electrode 79 overlies the gates and the power section.

The other components, including all control MOSFETs previously described, are preferably formed in one or more P wells, shown as P well 80.

It has been found that, during operation of the power section, the N(−) substrate can be negatively biased relative to the source electrode 79. Thus, if the P well 80 is directly connected to electrode 79 (source 12 in FIG. 2), the junction 81 will be forward biased. This produces minority carrier injection into the P well which will interfere with the operation of the components in the P well.

In accordance with another feature of the invention, a bipolar transistor means 90 is formed in the N(−) substrate, consisting of a P base 91 and N+ collector 92. The N(−) substrate is the emitter of the transistor. The base 91 has a contact 93 connected to source terminal 12, and the P well has a contact 94 also connected to source 12 through 10 ohm resistor 95. The actual value used must be so low that the bias current of the control circuit does not offset, too greatly, the ground of the control circuit with respect to source 12. N+ region 92 is connected to contact 94 via conductor 96.

In operation, if the N(−) region goes negative relative to the source 12, the transistor 90 turns on. The N+ region potential, and thus the potential of P well 80, is then pulled down to the potential of the N(−) substrate to prevent the forward biasing of junction 81.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOSgated semiconductor power device having a fault condition responsive control circuit integrated into the same die which contains a power section for said device; said device comprising a semiconductor die having first and second main electrodes and a gate electrode for controlling the conduction of current between said first and second main electrodes; said device having at least first, second and third connection pins; said first and second pins connected to said first and second main electrodes respectively; said fault condition responsive control circuit being formed in at least one separate well area within said semiconductor die; said fault condition responsive control circuit being operable to turn off a signal to said gate electrode in response to a predetermined fault condition; said fault condition responsive control circuit having an input terminal for a control voltage $V_{cc}$ needed for the biasing and operation of the components of said fault condition responsive control circuit; a first control MOSFET connected between said third connection pin and said gate electrode and a second control MOSFET connected between said gate electrode and one of said first and second main electrodes; said input terminal of said fault condition responsive control circuit being connected to the voltage at the node between said third pin and said first control MOSFET; said first control MOSFET being turned on and said second control MOSFET being turned off during the time that said MOSgated semiconductor power device is in normal conduction; said fault condition responsive control circuit being operable to turn off said first control MOSFET and turn on said second control MOSFET in response to a monitored fault condition.

2. The device of claim 1 wherein the resistance defined by said first control MOSFET is substantially less than 4000 ohms and the current drawn from said gate pin is less than about 1 milliampere during normal operation of said device.

3. The device of claim 1 wherein said fault condition responsive circuit is responsive to a predetermined overcurrent between said first and second main electrodes and to a die temperature above a given value.

4. The device of claim 2 wherein said fault condition responsive circuit is responsive to a predetermined overcurrent between said first and second main electrodes and to a die temperature above a given value.

5. The device of claim 1 wherein said power section defines a power MOSFET.

6. The device of claim 1 wherein said power section defines a MOSgated semiconductor device.

7. The device of claim 1 wherein said power section is an N(−) channel device and said first and second control MOSFETs are N channel devices.

8. The device of claim 7 wherein said fault condition responsive circuit includes a boot strap circuit which includes capacitor means which charges to a voltage higher than the voltage on said third pin to produce a voltage operable to turn on said first control MOSFET during normal operation.

9. The device of claim 1 which includes a trimmable temperature shutdown circuit in said fault condition responsive circuit; said temperature shutdown circuit comprising positive temperature coefficient circuit means for producing an output signal which rises with increasing die temperature; a negative temperature coefficient circuit comparator which has an input threshold decreasing with increasing die temperature; and circuit means for producing an output signal to turn off said power section when the die temperature exceed a predetermined temperature.

10. The device of claim 8 which includes a trimmable temperature shutdown circuit in said fault condition responsive circuit; said temperature shutdown circuit comprising positive temperature coefficient circuit means for producing an output signal which rises with increasing die temperature; a negative temperature coefficient circuit which produces an output signal which reduces with increasing die temperature; circuit means to compare the outputs of said positive and negative temperature coefficient circuits to establish a fixed reference temperature indication; and circuit means for producing an output signal to turn off said power section when the die temperature exceeds said reference temperature.

11. The device of claim 9 which includes a current source means coupled to said positive and negative temperature coefficient circuits for establishing a fixed reference output which is invariant with temperature; said current source means including a MOSFET device of trimmable channel width to adjust the value of said fixed reference output.

12. A trimmable shutdown circuit connected to the gate of a MOSgated power device having a semiconductor die; said trimmable shutdown circuit comprising positive temperature coefficient circuit means for producing an output signal which rises with increasing die temperature; a negative temperature coefficient comparator circuit which has an input threshold signal which reduces with increasing die temperature; and circuit means coupled to said positive temperature coefficient circuit and to said negative temperature comparator circuit for producing an output signal to turn off said MOSgate device when the temperature of said die exceeds a given temperature.

13. The device of claim 12 which includes a current source means coupled to said positive and negative temperature coefficient circuits for establishing a fixed reference output and coupled to said circuit means which is invariant with temperature; said current source means including a MOSFET device of trimmable channel width to adjust the value of said fixed reference output.

14. The device of claim 1 wherein said separate well area is a P type well in an N type substrate; and a control transistor means integrated into said N type substrate and having first and second main electrodes connected to said N type substrate and said P well respectively, and having a control electrode at the potential of said first main electrode of said device whereby, if said P well is biased positive relative to said substrate, said control transistor means turns on to connect said P well to the potential of said substrate to prevent turn-on of said P well/substrate junction.

15. The device of claim 14 wherein said control transistor means is a bipolar transistor.

16. A MOSgated device having a power section and a fault responsive control section integrated into a common semiconductor die; said power section having a source electrode; said control section being formed in a P type well in an N type substrate; and a transistor means integrated into said N type substrate and having first and second main electrodes connected to said N type substrate and said P well respectively, said transistor further having a control electrode connected to the potential of said source electrode whereby, if said P well is biased positive relative to said N type substrate, said transistor means turns on to connect said P well to the potential of said N type substrate thereby to prevent the turn on of the junction between said P well and said N type substrate.

17. The device of claim 16 wherein said transistor means is a bipolar transistor.

* * * * *